US012707966B2

(12) United States Patent
Pan et al.

(10) Patent No.: US 12,707,966 B2
(45) Date of Patent: Aug. 11, 2026

(54) SEMICONDUCTOR DEVICE

(71) Applicant: Taiwan Semiconductor Manufacturing Company, Ltd., Hsinchu (TW)

(72) Inventors: Chih-Chien Pan, Taipei City (TW); Pu Wang, Hsinchu City (TW); Li-Hui Cheng, New Taipei City (TW); Ying-Ching Shih, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 705 days.

(21) Appl. No.: 17/900,785

(22) Filed: Aug. 31, 2022

(65) Prior Publication Data

US 2024/0071857 A1 Feb. 29, 2024

(51) Int. Cl.

| | |
|---|---|
| ***H10W 40/22*** | (2026.01) |
| ***H10W 70/60*** | (2026.01) |
| ***H10W 70/65*** | (2026.01) |
| ***H10W 70/685*** | (2026.01) |
| ***H10W 70/69*** | (2026.01) |
| ***H10W 74/15*** | (2026.01) |
| ***H10W 76/10*** | (2026.01) |
| ***H10W 76/60*** | (2026.01) |
| ***H10W 76/63*** | (2026.01) |
| ***H10W 76/67*** | (2026.01) |
| ***H10W 90/00*** | (2026.01) |

(52) U.S. Cl.

CPC .......... *H10W 40/22* (2026.01); *H10W 70/611* (2026.01); *H10W 70/65* (2026.01); *H10W 70/69* (2026.01); *H10W 90/00* (2026.01); *H10W 90/401* (2026.01); *H10W 90/701* (2026.01); *H10W 70/685* (2026.01); *H10W 74/15* (2026.01); *H10W 76/10* (2026.01); *H10W 76/60* (2026.01); *H10W 76/63* (2026.01); *H10W 76/67* (2026.01); *H10W 90/724* (2026.01); *H10W 90/734* (2026.01)

(58) Field of Classification Search

None

See application file for complete search history.

(56) References Cited

U.S. PATENT DOCUMENTS

| | | | | |
|---|---|---|---|---|
| 9,000,584 | B2 * | 4/2015 | Lin | H10W 70/09 257/781 |
| 9,048,222 | B2 * | 6/2015 | Hung | H10W 20/20 |
| 9,048,233 | B2 * | 6/2015 | Wu | H10W 70/635 |
| 9,064,879 | B2 * | 6/2015 | Hung | H10W 74/014 |
| 9,111,949 | B2 * | 8/2015 | Yu | H10W 74/014 |
| 9,263,511 | B2 * | 2/2016 | Yu | H10D 1/68 |
| 9,281,254 | B2 * | 3/2016 | Yu | H10P 72/74 |
| 9,287,194 | B2 * | 3/2016 | Hung | H10W 42/121 |
| 9,368,460 | B2 * | 6/2016 | Yu | H10W 74/014 |

(Continued)

*Primary Examiner* — Dale E Page
*Assistant Examiner* — Rohit Parthasarathy
(74) *Attorney, Agent, or Firm* — JCIPRNET

(57) ABSTRACT

A semiconductor device includes a package substrate, a package component and at least one adhesive pattern. The package component has a thermal interface material (TIM) layer thereon. The adhesive pattern has a first surface facing the package substrate and a second surface opposite to the first surface, and the second surface of the at least one adhesive pattern is substantially coplanar with a surface of the TIM layer.

20 Claims, 12 Drawing Sheets

(56) References Cited

U.S. PATENT DOCUMENTS 9,372,206 B2 * 6/2016 Wu .................... G01R 31/2896
9,496,189 B2 * 11/2016 Yu .......................... H10P 74/23
10,098,220 B2 * 10/2018 Liang .................. H05K 1/0203
10,504,824 B1 * 12/2019 Pan ..................... H10W 70/698
10,957,611 B2 * 3/2021 Chang .................. H10W 76/12
11,239,136 B1 * 2/2022 Chen .................... H10W 40/70
11,521,905 B2 * 12/2022 Wang ................... H10W 40/22
11,626,344 B2 * 4/2023 Chen .................... H10W 40/70 257/713
11,923,259 B2 * 3/2024 Wang ................... H10W 40/22
12,062,592 B2 * 8/2024 Chan Arguedas .... H10W 40/70
2003/0085475 A1 * 5/2003 Im ......................... H10W 40/70 257/796
2011/0018125 A1 * 1/2011 Loo ...................... H10W 76/40 257/E23.101
2012/0068353 A1 * 3/2012 Huang ................ H10W 74/012 257/774
2012/0119346 A1 * 5/2012 Im ....................... H10W 74/117 257/E23.18
2018/0175011 A1 * 6/2018 Sung .................. H10W 74/114
2018/0350755 A1 * 12/2018 Huang ................ H10W 42/121
2019/0006259 A1 * 1/2019 Padmanabhan Ramalekshmi Thanu .................. H10W 40/22
2019/0006291 A1 * 1/2019 Neal .................. H10W 42/121
2019/0045666 A1 * 2/2019 Liang ................. H05K 7/20463
2019/0348340 A1 * 11/2019 Kwon .................. H10W 40/22
2019/0348343 A1 * 11/2019 Kwon ................ H10W 40/255
2020/0051894 A1 * 2/2020 Wan ...................... H10W 40/73
2020/0219786 A1 * 7/2020 Hung .................... H10W 40/22
2020/0373220 A1 * 11/2020 Chan Arguedas .... H10W 40/70
2020/0411395 A1 * 12/2020 Bozorg-Grayeli .... H10W 40/22
2021/0066151 A1 * 3/2021 Hu ......................... H10P 72/74
2021/0183724 A1 * 6/2021 Lee ....................... H10W 40/22
2021/0202455 A1 * 7/2021 Tsai ...................... H10W 76/60
2021/0225727 A1 * 7/2021 Chen ..................... H10W 40/22
2022/0020659 A1 * 1/2022 Zheng ................... H10W 40/22
2023/0021005 A1 * 1/2023 Chiou ................... H10W 40/22
2023/0378017 A1 * 11/2023 Hsieh .................... H10W 40/22
2024/0332113 A1 * 10/2024 Hsieh .................... H10W 40/22
2025/0054824 A1 * 2/2025 Huang .................. H10W 40/22
2025/0079283 A1 * 3/2025 Li ....................... H10W 70/685
2025/0096062 A1 * 3/2025 Hsieh .................. H10W 40/226

* cited by examiner

SEMICONDUCTOR DEVICE

BACKGROUND

The semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more of the smaller components to be integrated into a given area. These smaller electronic components may require smaller packages that utilize less area than previous packages. Currently, integrated fan-out packages are becoming increasingly popular for their compactness. How to ensure the reliability of the integrated fan-out packages has become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
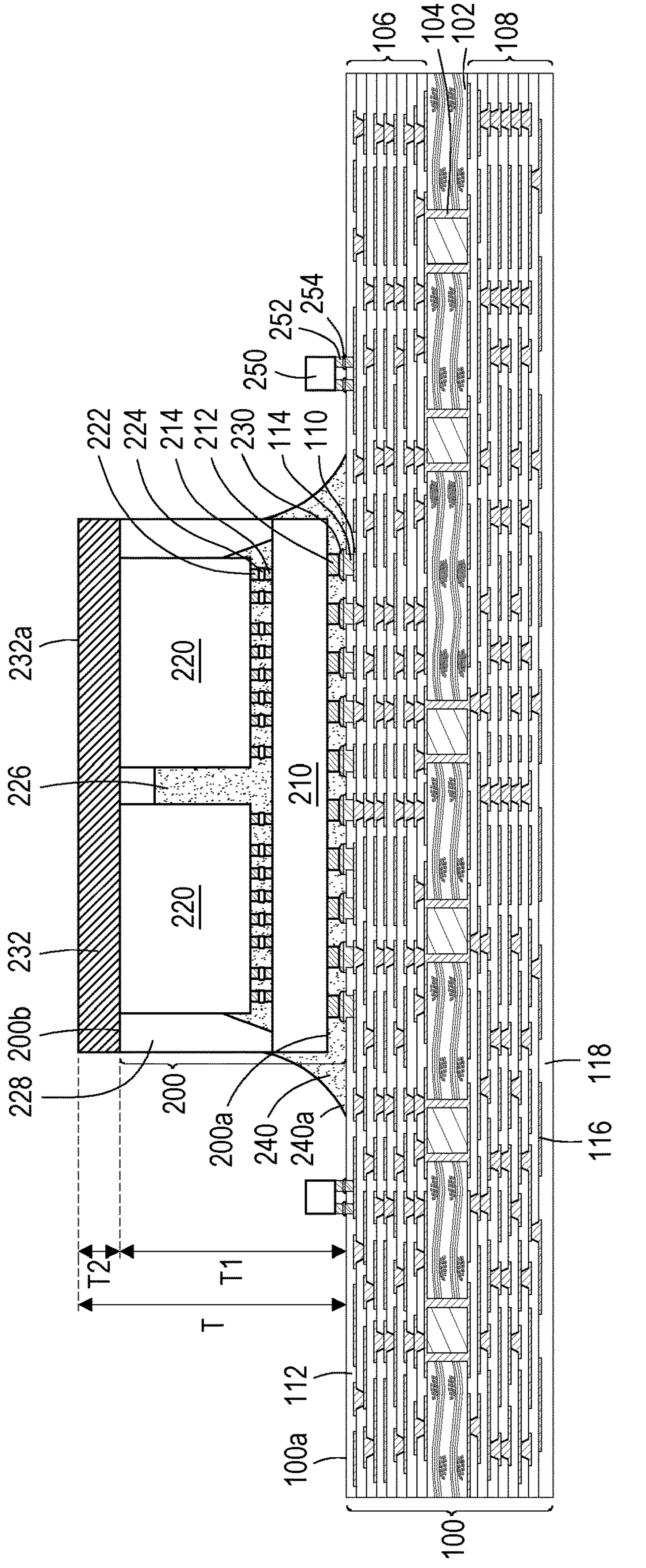
FIG. 1A to FIG. 1C are schematic cross-sectional views of various stages in a method of forming a semiconductor device according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
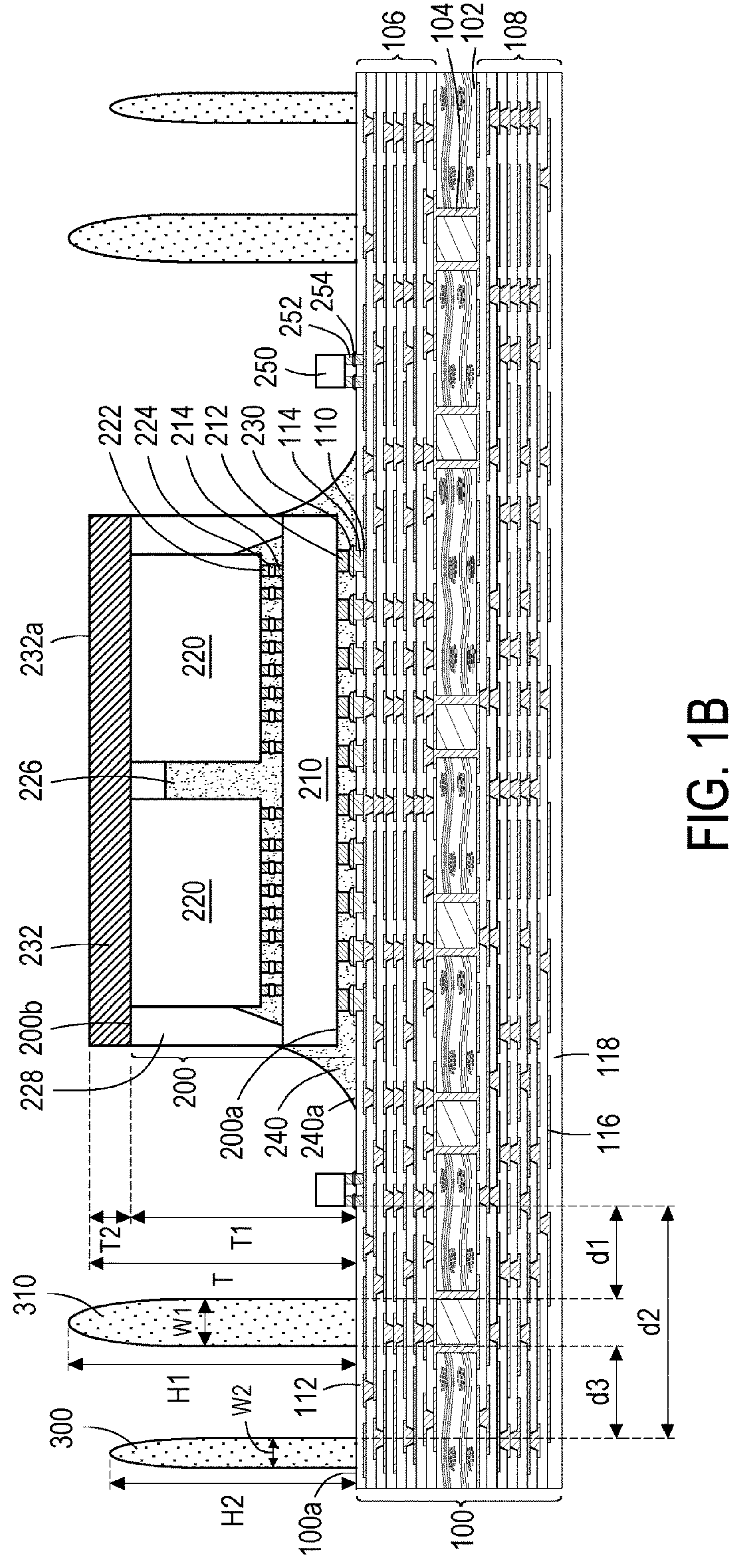
Figure 1C:
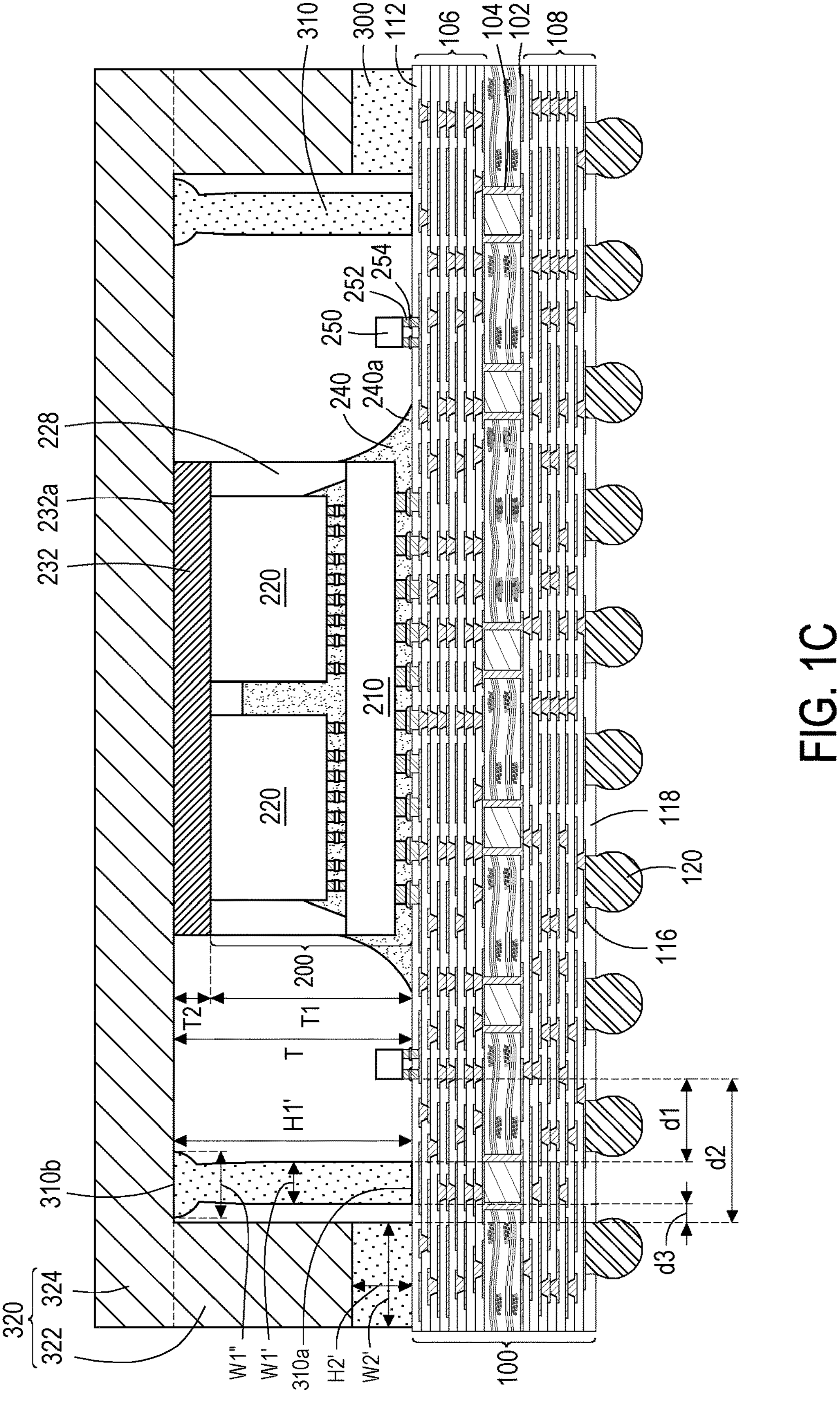

FIG. 1A to FIG. 1C are schematic cross-sectional views of various stages in a method of forming a semiconductor device according to some embodiments.

Referring to FIG. 1A, a package component 200 is placed on a package substrate 100. The package substrate 100 includes a substrate core 102, which may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations thereof, or the like, may also be used. Additionally, the substrate core 102 may be a SOI substrate. Generally, an SOI substrate includes a layer of a semiconductor material such as epitaxial silicon, germanium, silicon germanium, SOI, SGOI, or combinations thereof. In another embodiment, the substrate core 102 is an insulating core such as a fiberglass reinforced resin core. One example core material is fiberglass resin such as FR4. Alternatives for the core material include bismaleimide-triazine (BT) resin, or alternatively, other printed circuit board (PCB) materials or films.

In some embodiments, the substrate core 102 includes active and passive devices (not separately illustrated). Devices such as transistors, capacitors, resistors, combinations thereof, and the like may be used to generate the structural and functional requirements of the design for the system. The devices may be formed using any suitable methods. In some embodiments, the substrate core 102 is substantially free of active and passive devices. In some embodiments, the substrate core 102 further includes conductive vias 104, which may be also referred to as TSVs.

The package substrate 100 may also include a redistribution structure. In some embodiments, the redistribution structure is formed of alternating layers of dielectric material (e.g., low-k dielectric material) and conductive material (e.g., copper) with vias interconnecting the layers of conductive material, and is formed through any suitable process (such as deposition, damascene, or the like). In other embodiments, the redistribution structure is formed of alternating layers of dielectric material (e.g., build up films such as Ajinomoto build-up film (ABF) or other laminates) and conductive material (e.g., copper) with vias interconnecting the layers of conductive material, and is formed through any suitable process (such as lamination, plating, or the like).

In the illustrated embodiment, the package substrate 100 includes redistribution structures 106 and 108 formed on opposing surfaces of the substrate core 102, such that the substrate core 102 is interposed between the redistribution structure 106 and the redistribution structure 108. The conductive vias 104 electrically couple the redistribution structure 106 to the redistribution structure 108. In alternative embodiments, the redistribution structure 106 or the redistribution structure 108 is omitted.

In some embodiments, bond pads 110 and a solder resist layer 112 are formed on the redistribution structure 106, with the bond pads 110 being exposed by openings formed in the solder resist layer 112. The bond pads 110 may be a part of the redistribution structure 106 and may be formed together with other conductive features of the redistribution structure 106. The solder resist layer 112 may include a suitable insulating material (such as a dielectric material, a polymer material, or the like) and may be formed using any suitable deposition methods.

In some embodiments, conductive connectors 114 extend through the opening in the solder resist layer 112 and contact the bond pads 110. The conductive connectors 114 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. In the illustrated embodiment, the conductive connectors 114 includes solder balls.

In some embodiments, bond pads 116 and a solder resist layer 118 are formed on the redistribution structure 108. The bond pads 116 may be a part of the redistribution structure 108 and may be formed together with other conductive features of the redistribution structure 108. The solder resist layer 118 may include a suitable insulating material (such as a dielectric material, a polymer material, or the like) and may be formed using any suitable deposition methods.

In some embodiments, the package component 200 is a wafer-level package component. The package component 200 has a surface 200*a* (e.g., bottom surface) facing the package substrate 100 and a surface 200*b* (e.g., top surface) opposite to the surface 200*a*. In the illustrated embodiment, the package component 200 includes a plurality of integrated circuit dies 220 bonded to an interposer 210 and encapsulated by an encapsulant 228. The interposer 210 may have a substrate (not shown), an interconnect structure (not shown) on a surface of the substrate and conductive vias (not shown) penetrating through the substrate. The substrate may be a substrate of silicon, doped or undoped, or an active layer of a semiconductor-on-insulator (SOI) substrate. The substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The redistribution structures and the conductive vias may be formed using similar materials and methods as the redistribution structure 106, 108 and the conductive vias 104, and the description is not repeated herein.

The interposer 210 may have conductive connectors 212, 214 at the outermost surfaces of the integrated circuit die 220 respectively. The conductive connectors 212, 214 may include underbump metallizations (UBMs) and solder regions over the UBMs. The UBMs may be conductive pillars, pads, or the like. In some embodiments, the UBMs may be formed by forming a seed layer over the interconnect structure. The seed layer may be a metal layer, which may be a single layer or a composite layer including a plurality of sub-layers formed of different materials. In some embodiments, the seed layer includes a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may include a metal, such as copper, titanium, tungsten, aluminum, nickel, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process. The remaining portions of the seed layer and conductive material form the UBMs.

The integrated circuit dies 220 are the same or different. Each integrated circuit die 220 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. The integrated circuit die 220 may include a semiconductor substrate (not shown), a device layer (not shown) and an interconnect structure (not shown). The semiconductor substrate may be a substrate of silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

The device layer may include active devices (e.g., transistors, diodes, etc.), capacitors, resistors, the like, or combinations thereof and an inter-layer dielectric (ILD) surrounding and covering the devices. The ILD may include one or more dielectric layers formed of materials such as phospho-silicate glass (PSG), boro-silicate glass (BSG), boron-doped phospho-silicate glass (BPSG), undoped silicate glass (USG), or the like. Conductive plugs (not separately illustrated) may extend through the ILD to electrically and physically couple the devices. For example, when the devices are transistors, the conductive plugs couple the gates and source and drain regions of the transistors. The conductive plugs may be formed of tungsten, cobalt, nickel, copper, silver, gold, aluminum, the like, or combinations thereof.

The interconnect structure is over the device layer, and is used to electrically connect the devices of the semiconductor substrate to form an integrated circuit. The interconnect structure may be over the ILD and the conductive plugs. The interconnect structure may include one or more dielectric layer(s) and respective metallization layer(s) in the dielectric layer(s). Acceptable dielectric materials for the dielectric layers include low-k dielectric materials such as PSG, BSG, BPSG, USG, or the like. Acceptable dielectric materials for the dielectric layers further include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The metallization layers may include conductive vias and/or conductive lines to interconnect the devices of the semiconductor substrate. The metallization layers may be formed of a conductive material, such as a metal, such as copper, cobalt, aluminum, gold, combinations thereof, or the like. The interconnect structure may be formed by a damascene process, such as a single damascene process, a dual damascene process, or the like.

In some embodiments, the integrated circuit dies 220 include a plurality of conductive connectors 222 at the outermost surfaces. The conductive connectors 222 are similar to the conductive connectors 212, 214 described above, and the description is not repeated herein. In the illustrated embodiment, the conductive connectors 222 include UBMs, and solder regions over the UBMs. In some embodiments, the conductive connectors 222 are in physical contact with respective conductive connectors 214, such that the solder regions of the conductive connectors 222 are in physical contact with the respective conductive connectors 214 and form the solder joints 224 therebetween. The solder joints 224 electrically and mechanically couple the integrated circuit dies 220 to the interposer 210.

In some embodiments, an underfill 226 is formed around the solder joints 224, and in a gap between the integrated circuit dies 220 and the interposer 210. The underfill 226 may reduce stress and protect the solder joints 224. The underfill 226 may be formed of an underfill material such as a molding compound, epoxy, or the like. The underfill 226 may be formed by a capillary flow process after the integrated circuit dies 220 is attached to the interposer 210, or may be formed by a suitable deposition method before the integrated circuit dies 220 are attached to the interposer 210. The underfill 226 may be applied in liquid or semi-liquid form and then subsequently cured. In some embodiments, the underfill 226 extends along sidewalls of the integrated circuit dies 220. However, the disclosure is not limited thereto. In alternative embodiments, the underfill 226 is omitted.

The encapsulant 228 may encapsulate the integrated circuit dies 220 and the underfill 226. The encapsulant 228 may be a molding compound, epoxy, or the like. The encapsulant 228 may not include fillers therein. The encapsulant 228 may be applied by compression molding, transfer molding, or the like, and is formed over the interposer 210 such that the integrated circuit dies 220 are buried or covered. The encapsulant 228 may be applied in liquid or semi-liquid form and then subsequently cured. In some embodiments, sidewalls of the encapsulant 228 are substantially flush with sidewalls of the interposer 210. In alternative embodiments, the package component 200 has other suitable structure.

In some embodiments, a thermal interface material (TIM) layer 232 is disposed on the package component 200. The TIM layer 232 may include a thermal interface material having a high thermal conductivity. The material of the TIM layer 232 may be a polymer. In some embodiments, the TIM layer 232 includes a polymer with thermal conductive fillers. The thermal conductive fillers may increase the effective thermal conductivity of the TIM layer 232 to be from about 10 W/mK to about 50 W/mK or more. Applicable thermal conductive filler materials may include aluminum oxide, boron nitride, aluminum nitride, aluminum, copper, silver, indium, a combination thereof, or the like. In other embodiments, the TIM layer 232 includes other materials such as a metallic-based or solder-based material comprising silver, indium paste, or the like. In still further embodiments, the TIM layer 232 includes a film-based or sheet-based material, such as a sheet-based material including synthesized carbon nanotubes (CNTs) or a thermally conductive sheet having vertically oriented graphite fillers. The TIM layer 232 may have a single layer structure or a multiple layer structure. The TIM layer 232 may be formed on the surface 200*b* (e.g., outermost surface) of the package component 200 by a lamination process, a dispensing process, the like, combinations thereof, or any other suitable process. In some embodiments, sidewalls of the TIM layer 232 are substantially flush with sidewalls of the package component 200. For example, the sidewalls of the TIM layer 232 are substantially flush with the sidewalls of the encapsulant 228 and the interposer 210. The package component 200 may have a thickness T1, and the TIM layer 232 may have a thickness T2. In some embodiments, a total thickness T of the thickness T1 and the thickness T2 is in a range of 50 μm to 150 μm. For example, the total thickness T is measured from a surface 100*a* of the package substrate 100 to a surface layer 232*a* of the TIM layer 232.

In some embodiments, the package component 200 is placed on the surface 100*a* of the package substrate 100 using, e.g., a pick-and-place tool. After placing the package component 200 on the package substrate 100, the conductive connectors 212 are in physical contact with respective conductive connectors 114, such that the solder regions of the conductive connectors 212 are in physical contact with the respective conductive connectors 114. In some embodiments, after placing the package component 200 on the package substrate 100, a reflow process is performed to mechanically and electrically attach the package component 200 to the package substrate 100. The reflow process melts and merges the solder regions of the conductive connectors 212 and respective solder materials of the conductive connectors 114 into solder joints 230. The solder joints 230 electrically and mechanically couple the package component 200 to the package substrate 100.

In some embodiments, an underfill 240 is formed around the solder joints 230, and in a gap between the package component 200 and the package substrate 100. The underfill 240 may reduce stress and protect the solder joints 230. The underfill 240 may be formed of an underfill material such as a molding compound, epoxy, or the like. The underfill 240 may be formed by a capillary flow process after the package component 200 is attached to the package substrate 100, or may be formed by a suitable deposition method before the package component 200 are attached to the package substrate 100. The underfill 240 may be applied in liquid or semi-liquid form and then subsequently cured. In some embodiments, the underfill 240 extends along the sidewalls of the package component 200. For example, the underfill 240 extends along the sidewalls of the interposer 210 and the encapsulant 228.

Figure 2A:
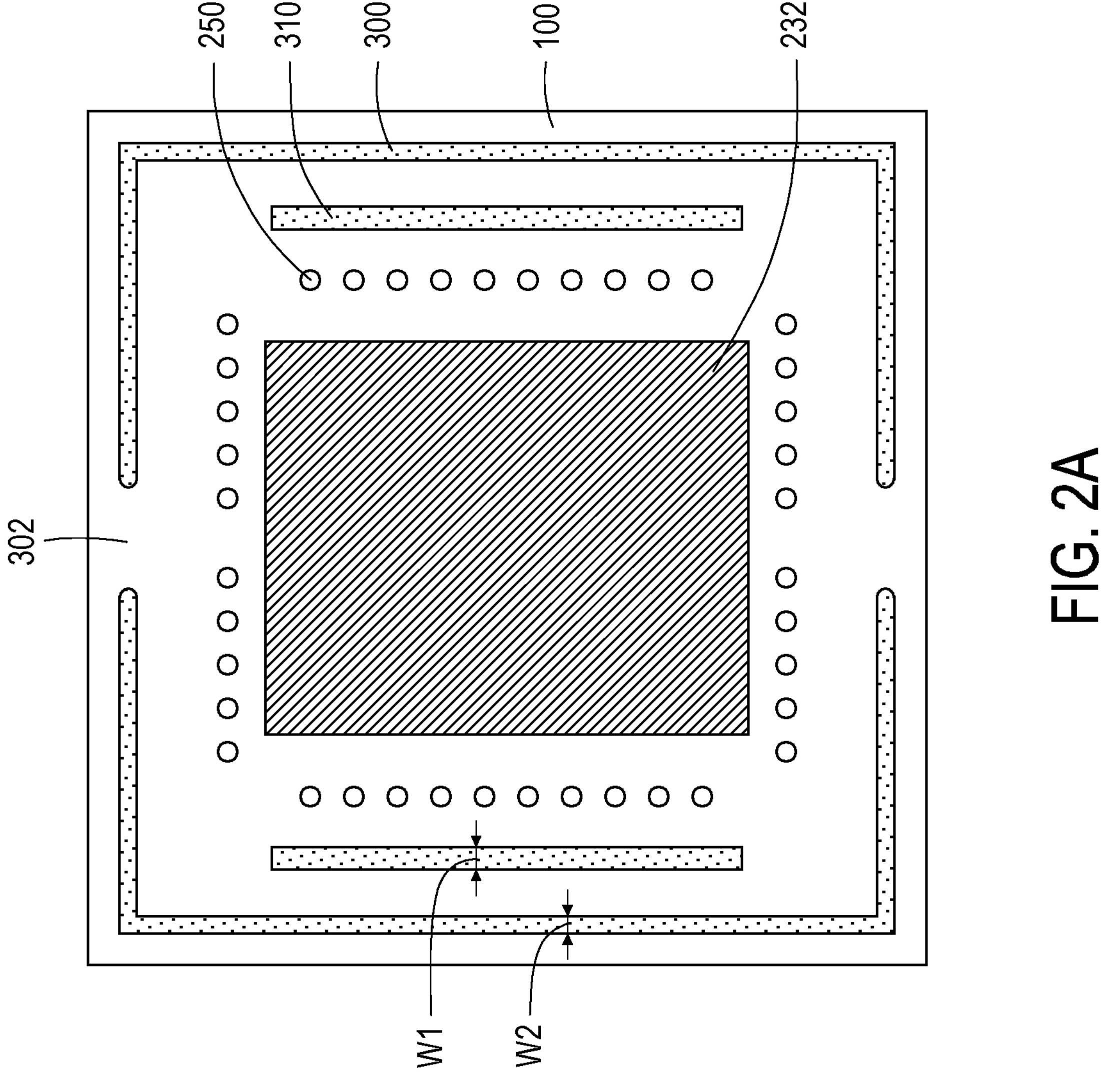
FIG. 2A illustrates a top view of a semiconductor device of FIG. 1B in accordance with some embodiments of the disclosure.

In some embodiments, a plurality of passive devices 250 are formed on the package substrate 100 aside the package component 200. For example, as shown in FIG. 2A, the passive devices 250 are formed to surround the package component 200. However, the disclosure is not limited thereto. The passive devices 250 may have any other suitable arrangement. The passive devices 250 may be capacitors, resistors or inductors. The passive devices 250 may be bonded to the package substrate 100 as the package component 200. For example, conductive connectors 252 of the passive devices 250 include UBMs and solder regions over the UBMs. The solder regions of the conductive connectors 252 are in physical contact with respective conductive connectors (e.g., conductive connectors 114), and merged with respective solder materials of the conductive connectors 114 into solder joints 254 by the reflow process, for example. In some embodiments, as shown in FIG. 1A, the passive devices 250 are separated from an edge 240*a* of the underfill 240.

Referring to FIG. 1B, an adhesive layer 300 and at least one adhesive pattern 310 are formed on the surface 100*a* of the package substrate 100. In some embodiments, the adhesive layer 300 is formed to surround the package component 200 and the passive devices 250, and the adhesive patterns 310 are formed between the adhesive layer 300 and the package component 200. For example, the adhesive layer 300 is formed along a periphery of the package component 200, and the adhesive patterns 310 are formed at opposite sides of the package component 200. In some embodiments, the adhesive patterns 310 are separated from the edge 240*a* of the underfill 240 and disposed between the adhesive layer 300 and the passive devices 250. In some embodiments, as shown in FIG. 1B, a distance d1 between the passive device 250 and the adhesive pattern 310 is smaller than a distance d2 between the passive device 250 and the adhesive layer 300. A distance d3 is formed between the adhesive layer 300 and the adhesive pattern 310. In some embodiments, the distance d1, d2 and d3 is respectively larger than 0. In other words, the adhesive pattern 310 is physically separated from the adhesive layer 300 and the passive device 250 without contacting, respectively. In some embodiments, the distance d3 between the adhesive patterns 310 and the adhesive layer 300 is chosen, and thus the adhesive patterns 310 and the adhesive layer 300 remain separated when the adhesive layer 300 is pressed by a heat dissipation lid 320 to be bonded. In some embodiments, the adhesive layer 300 and the adhesive patterns 310 are formed on the solder resist layer 112 of the package substrate 100. The adhesive layer 300 and the adhesive patterns 310 are in direct contact with the package substrate 100 (e.g., solder resist layer 112 of the package substrate 100).

Figure 3A:
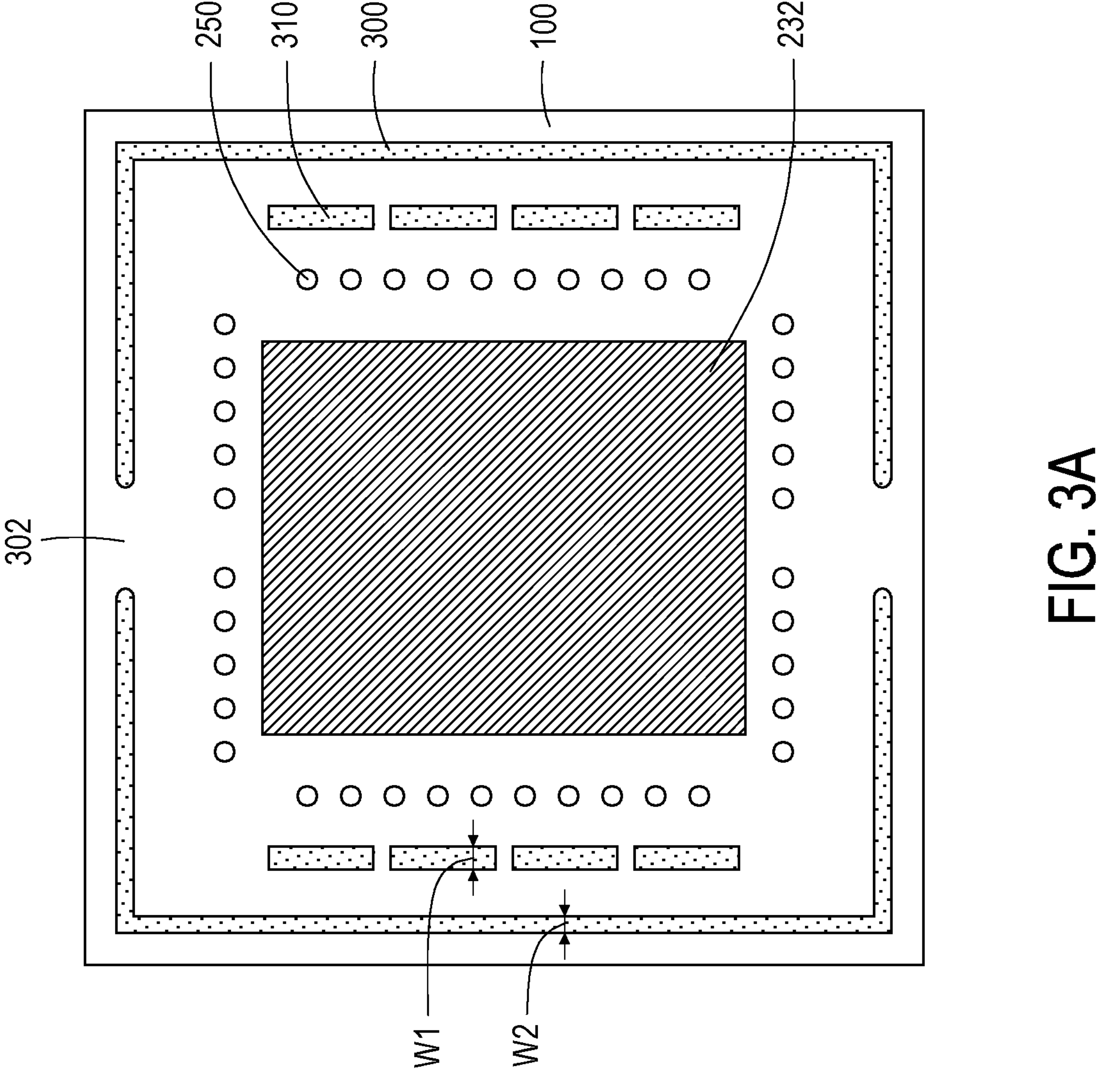
FIG. 3A to FIG. 3D respectively illustrate a top view of a semiconductor device in accordance with some embodiments of the disclosure.
Figure 3B:
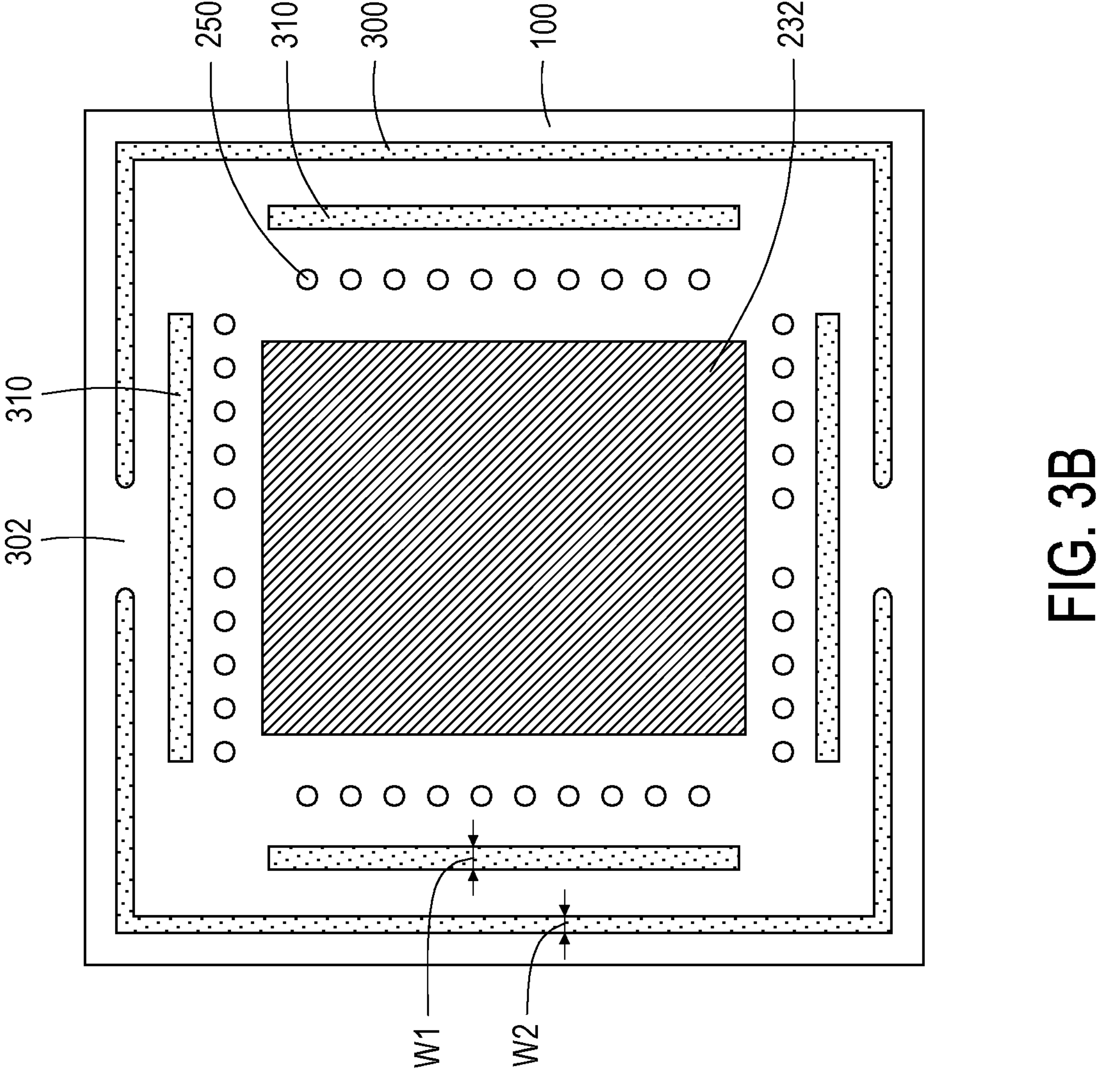
Figure 3C:
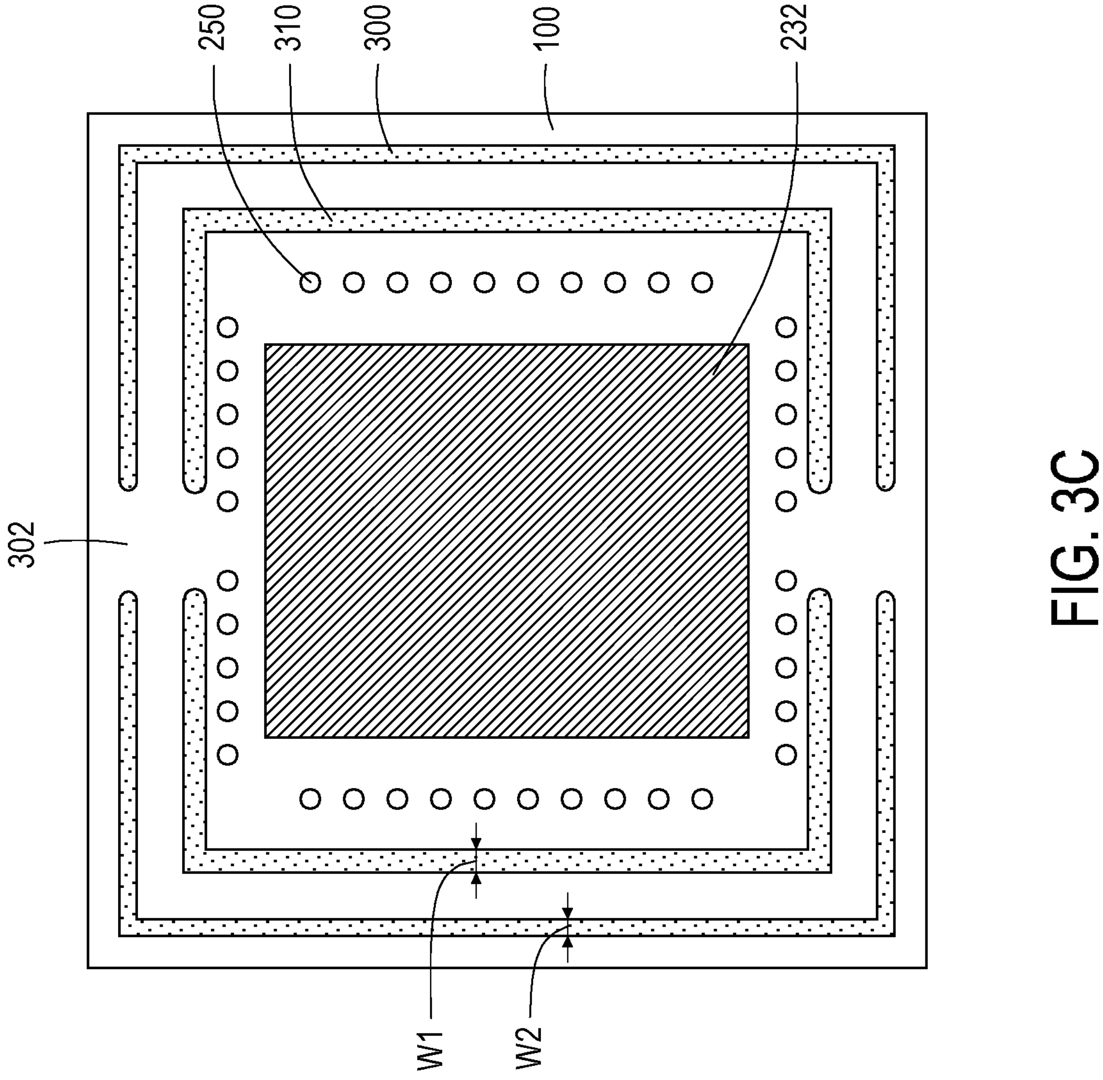

As shown in FIG. 2A, from a top view, the adhesive patterns 310 may be disposed at opposite sides of the package component 200 while the adhesive layer 300 is formed to surround the package component 200. For example, the adhesive layer 300 is disposed at first to fourth sides of the package component 200, and the adhesive patterns 310 is disposed at the first and third sides opposite to each other. However, the disclosure is not limited thereto. The adhesive patterns 310 may be disposed at one, two, three or four sides of the package component 200 according to the requirements. The adhesive pattern 310 may have a length substantially the same as a length of the side of the package component 200. However, the disclosure is not limited thereto. The adhesive pattern 310 may have any suitable length larger than or smaller than the length of the side of the package component 200. In some embodiments, the adhesive patterns 310 are bar-shaped, rectangular shaped, column shaped or wall shaped. In alternative embodiments, the adhesive pattern 310 is island-shaped as shown in FIG. 3A, ring-shaped as shown in FIG. 3B, C-shaped as shown in FIG. 3C, the like, or combinations thereof or has any other suitable shape. In an embodiment as shown in FIG. 3A, the adhesive patterns 310 are arranged to surround the package component 200. The adhesive patterns 310 are separated by a constant distance or a non-constant distance. In some embodiments, the adhesive layer 300 is illustrated as a ring and has at least one vent 302. However, the disclosure is not limited thereto. The adhesive layer 300 may have other suitable shapes.

Figure 3D:
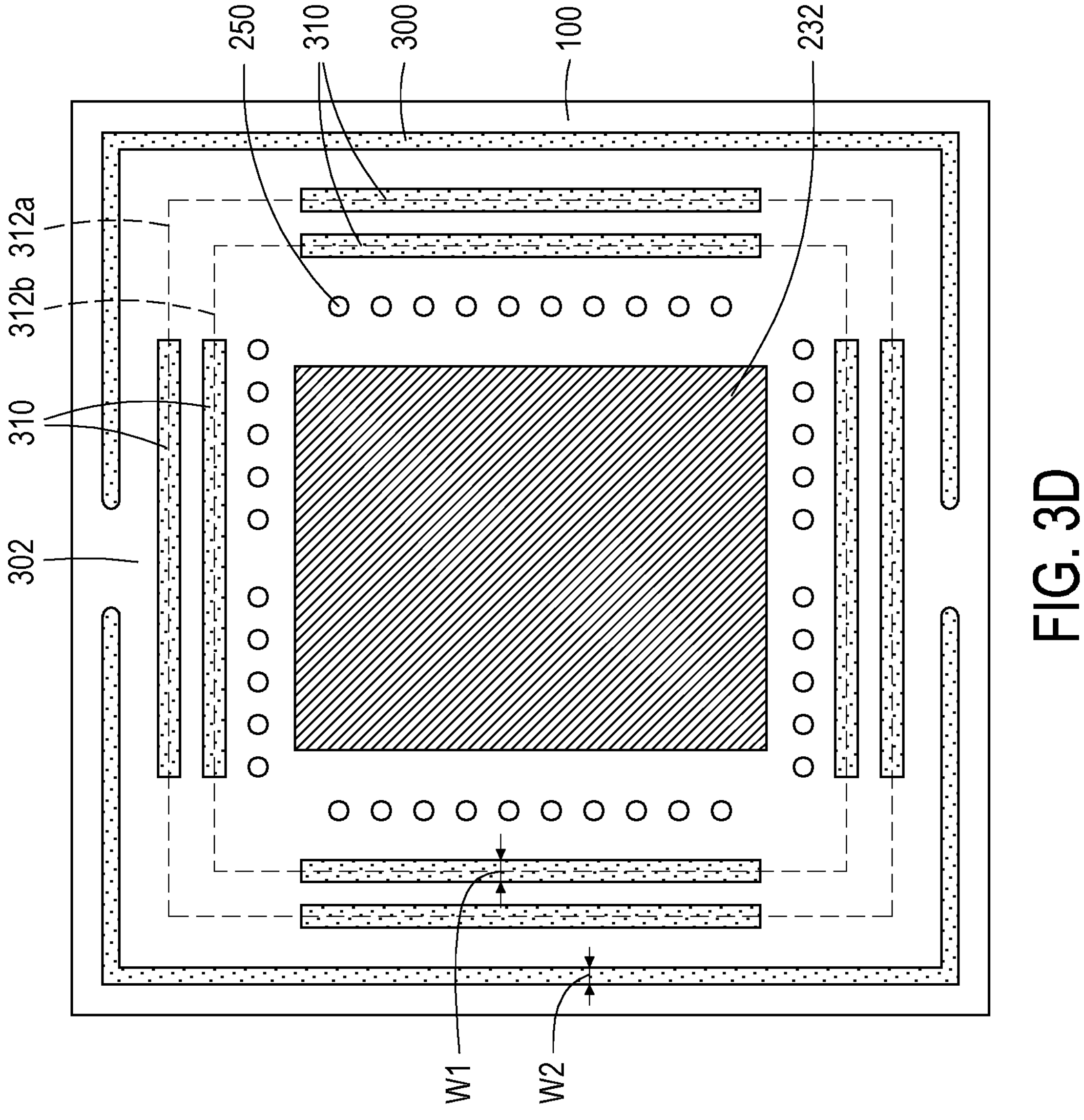

In alternative embodiments, as shown in FIG. 3D, the adhesive patterns 310*a*, 310*b* are arranged along at least two paths 312*a*, 312*b* different from each other. For example, the first path 312*a* is along the periphery of the package component 200, and the second path 312*b* is along the periphery of the package component 200 and between the first path 312*a* and the package component 200. In such embodiments, the adhesive patterns 310 support the heat dissipation lid 320 to be bonded at different locations. The adhesive patterns 310 may have any suitable shape and arrangement. For example, the adhesive patterns 310 along the first path 312*a* are at one, two, three or four sides of the package component 200, and similarly, the adhesive patterns 310 along the first path are at one, two, three or four sides of the package component 200. The width W1 of the adhesive patterns 310 in the same path (e.g., first path 312*a* or second path 312*b*) or in different paths (e.g., first path 312*a* and second path 312*b*) may be substantially the same or different. In such embodiments, after bonding to the heat dissipation lid 320, the adhesive patterns 310 in different paths (e.g., first path 312*a* and second path 312*b*) may be merged to one or remain separated.

The adhesive patterns 310 and the adhesive layer 300 may respectively have an adhesive material. The adhesive material of the adhesive patterns 310 and the adhesive layer 300 includes epoxy-based material, silicone-based material, a metal-based material, combinations thereof, or the like. The adhesive material of the adhesive patterns 310 may be substantially the same as or different from the adhesive layer 300. The adhesive material of the adhesive patterns 310 may be different from the underfill 240. The adhesive layer 300 is also referred to as a die attach film, which is used for adhering a lid. The adhesive patterns 310 may be also referred to as supporting pattern or enforcing pattern. The adhesive patterns 310 and the adhesive layer 300 may be formed by a dispensing method or any other suitable process. In some embodiments, the adhesive patterns 310 and the adhesive layer 300 are formed after or before the formation of the TIM layer 232. In some embodiments, as shown in FIG. 1B, a height H1 of the adhesive pattern 310 is larger than or substantially equal to the total thickness T of the package component 200 and the TIM layer 232, to ensure the adhesive pattern 310 to contact with the heat dissipation lid 320 of FIG. 1C. A height H2 of the adhesive layer 300 is smaller than the height H1 of the adhesive pattern 310, and also smaller than the total thickness T of the package component 200 and the TIM layer 232, that is, H1>T>H2, for example. In some embodiments, the height H1 is in a range of 1 mm to 1.5 mm, and a height difference between the height H1 and the total thickness T is in a range of 0.2 mm to 0.6 mm. The height H2 is in a range of 0.5 mm to 0.8 mm, for example. In some embodiments, a width W1 of the adhesive pattern 310 is larger than a width W2 of the adhesive layer 300. However, the disclosure is not limited thereto. The width W1 of the adhesive pattern 310 may be substantially equal to or smaller than the width W2 of the adhesive layer 300.

Referring to FIG. 1C, a heat dissipation lid 320 is attached to the surface 100*a* of the package substrate 100 through the adhesive layer 300 and the adhesive patterns 310, to cover and surround the package component 200. The heat dissipation lid 320 may be attached to the solder resist layer 112 of the package substrate 100 by the adhesive layer 300 and the adhesive patterns 310. In some embodiments, after the heat dissipation lid 320 is attached to the adhesive layer 300, a curing process is performed. In some embodiments, the curing process is performed on the adhesive layer 300 and the adhesive patterns 310 at a temperature of between about 120° C. and 180° C. for a period of time. However, any suitable temperature and duration may be employed during the curing step. In some embodiments, the TIM layer 232 is formed after or before the formation of the adhesive layer 300 and the adhesive patterns 310 as long as before the placement of the heat dissipation lid 320.

In some embodiments, the heat dissipation lid 320 includes a high thermal conductivity material, such as a metal, a metal alloy, or the like. The heat dissipation lid 320 may include a first portion 322 and a second portion 324 physically connecting to the first portion 322. The first portion 322 is a vertically extending portion and is wall-shaped, for example. The second portion 324 is a horizontally extending portion and is plate-shaped, and the second portion 324 is integrally formed with the first portion 322, for example. After the heat dissipation lid 320 is attached to the package substrate 100, the first portion 322 of the heat dissipation lid 320 is in direct contact with the adhesive layer 300 and surrounds the package component 200 with the TIM layer 232 thereon, the passive devices 250 and the adhesive patterns 310. The second portion 324 of the heat dissipation lid 320 covers the package component 200 with the TIM layer 232, the passive devices 250 and the adhesive patterns 310.

In some embodiments, after attaching the heat dissipation lid 320 to the package substrate 100, the second portion 324 of the heat dissipation lid 320 is in direct contact with the adhesive patterns 310 and the TIM layer 232. The adhesive pattern 310 has a first surface 310*a* and a second surface 310*b* opposite to the first surface 310*a*. In some embodiments, the first surface 310*a* of the adhesive pattern 310 faces and is in direct contact with the surface 100*a* of the package substrate 100 (e.g., solder resist layer 112), and the second surface 310*b* of the adhesive pattern 310 faces and is in direct contact with the heat dissipation lid 320 (e.g., second portion 324 of the heat dissipation lid 320). In other words, the adhesive pattern 310 is disposed between and physically connects the heat dissipation lid 320 and the package substrate 100, so as to provide adherence and support for the heat dissipation lid 320. In some embodiments, as shown in FIG. 1C, the second surface 310*b* of the adhesive pattern 310 is substantially coplanar with the surface layer 232*a* of the TIM layer 232. That is, the height H1' of the adhesive pattern 310 is substantially equal to the total thickness T of the package component 200 and the TIM layer 232 since the adhesive pattern 310 is pressed by the heat dissipation lid 320. In some embodiments, the adhesive pattern 310 provides support for the heat dissipation lid 320, and thus ensures the heat dissipation lid 320 to contact with the TIM layer 232. For example, the surface layer 232*a* of the TIM layer 232 is in direct contact with the heat dissipation lid 320 entirely. In such embodiments, a coverage of TIM layer 232 (e.g., a percentage of contact area with the heat dissipation lid 320 to total area of the surface layer 232*a* of the TIM layer 232) is large such as larger than 95%. Accordingly, the heat dissipation lid 320 provides good heat dissipation for the package component 200.

Figure 2B:
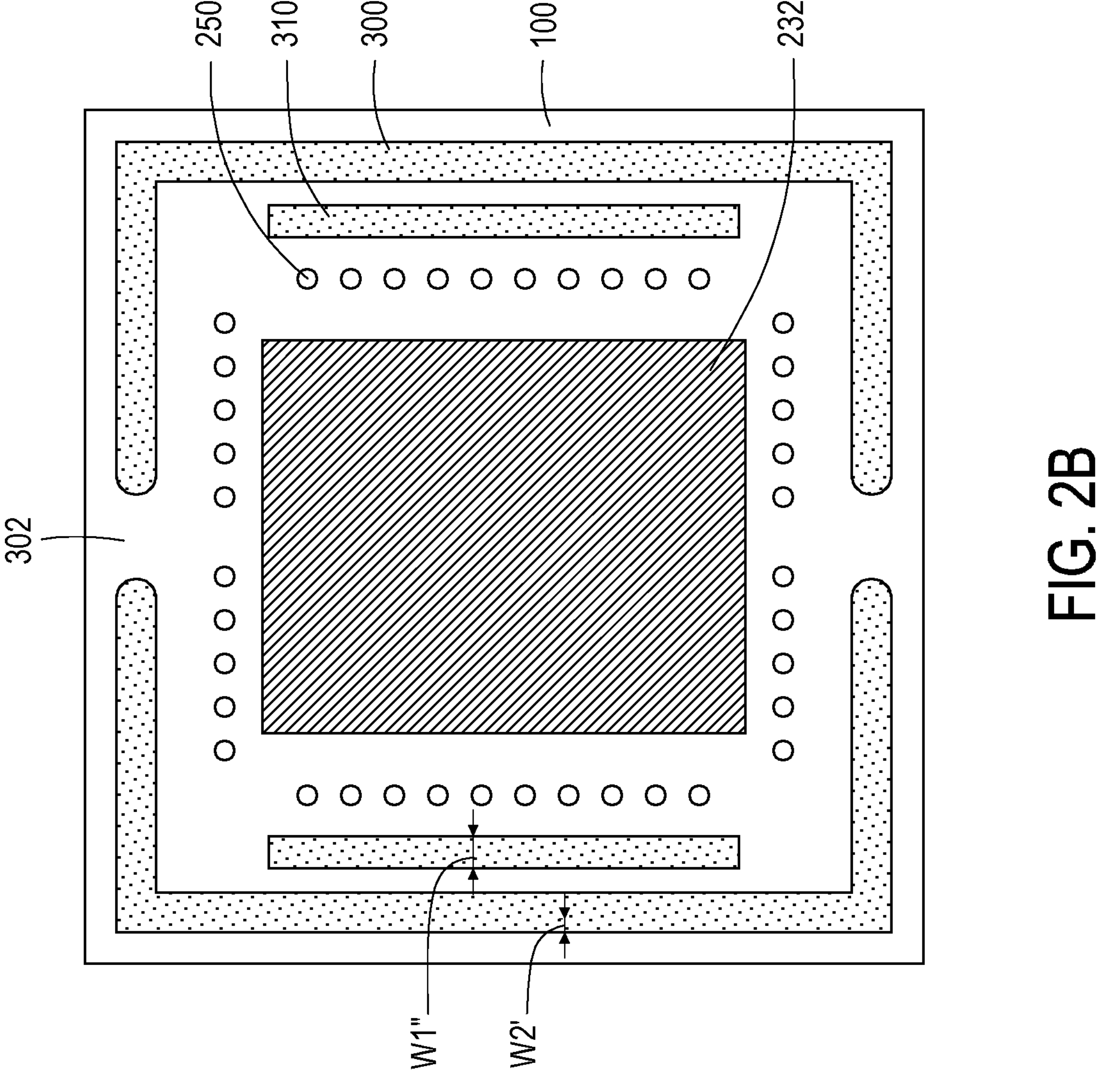
FIG. 2B illustrates a top view of a semiconductor device of FIG. 1C in accordance with some embodiments of the disclosure.

Referring to FIG. 1C and FIG. 2B, after adhering to the heat dissipation lid 320, the height of the adhesive layer 300 is reduced to H2', and the width W2' of the adhesive layer 300 is increased. In some embodiments, a width W1" of a top portion (e.g., a portion being in direct contact with the heat dissipation lid 320) of the adhesive pattern 310 is larger than a width W1' of other portions of the adhesive pattern 310. The width W1" of the adhesive pattern 310 may increase as the adhesive pattern 310 becomes closer to the heat dissipation lid 320. The width W1' may be substantially constant. In some embodiments, the width W1' is substantially the same as the width W1 of the adhesive pattern 310 before bonding to the heat dissipation lid 320, and the width W1" is larger than the width W1. In such embodiments, the top portion of the adhesive pattern 310 has a curved (concave or convex) or a slanted sidewall. The width W2' of the adhesive layer 300 may be substantially the same as a width of the first portion 322 of the heat dissipation lid 320. For example, sidewalls of the adhesive layer 300 are substantially flush with sidewalls of the first portion 322 of the heat dissipation lid 320. However, the disclosure is not limited thereto. The width W1', W1", W2' of the adhesive pattern 310 and/or the adhesive layer 300 may be adjusted based on the requirements.

In some embodiments, as shown in FIG. 1C, the distance d3 between the adhesive layer 300 and the adhesive pattern 310 is smaller than the distance d3 of FIG. 1*i*, and the distance d2 between the adhesive layer 300 and the passive device 250 is also smaller than the distance d3 of FIG. 1B. In some embodiments, the distance d1, d2 and d3 is respectively larger than 0. In other words, after bonding of the heat dissipation lid 320, the adhesive pattern 310 remains physically separated from the adhesive layer 300 and the passive device 250 without contacting, respectively.

In some embodiments, after the heat dissipation lid 320 is formed, conductive connectors 120 extend through openings in the solder resist layer 118 and contact the bond pads 116. The bond pads 116 are exposed by openings formed in the solder resist layer 118. The conductive connectors 120 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. In the illustrated embodiment, the conductive connectors 120 includes solder balls.

In alternative embodiments in which the adhesive pattern 310 is absent, the bending (e.g., warpage) of the package component 200 occurs at a high temperature such as the curing temperature, which reduces the adhesion between the heat dissipation lid 320 and the TIM layer 232. Accordingly, the delamination of the TIM layer 232 occurs, and the coverage of the TIM layer 232 is low. On contrary, in some embodiments, the adhesive pattern 310 increases the adhesion between the heat dissipation lid 320 and the package substrate 100 and provides support for the heat dissipation lid 320, and thus the delamination of the TIM layer 232 is prevented and the coverage (e.g., larger than 95% or 98%) of the TIM layer 232 is improved. Accordingly, the heat dissipation lid 320 may provide good thermal dissipation (e.g., low thermal resistance) for the package component 200 through the TIM layer 232, and the performance of the package component 200 is improved. In addition, the warpage of the concave shape of the package substrate 100 and the package component 200 may be eliminated. Furthermore, since the adhesive pattern 310 may be designed or controlled without touching (e.g., bleeding on) the package component 200 and the passive devices 250, and thus there is substantially no impact on the package component 200 and the passive devices 250.

Figure 4:
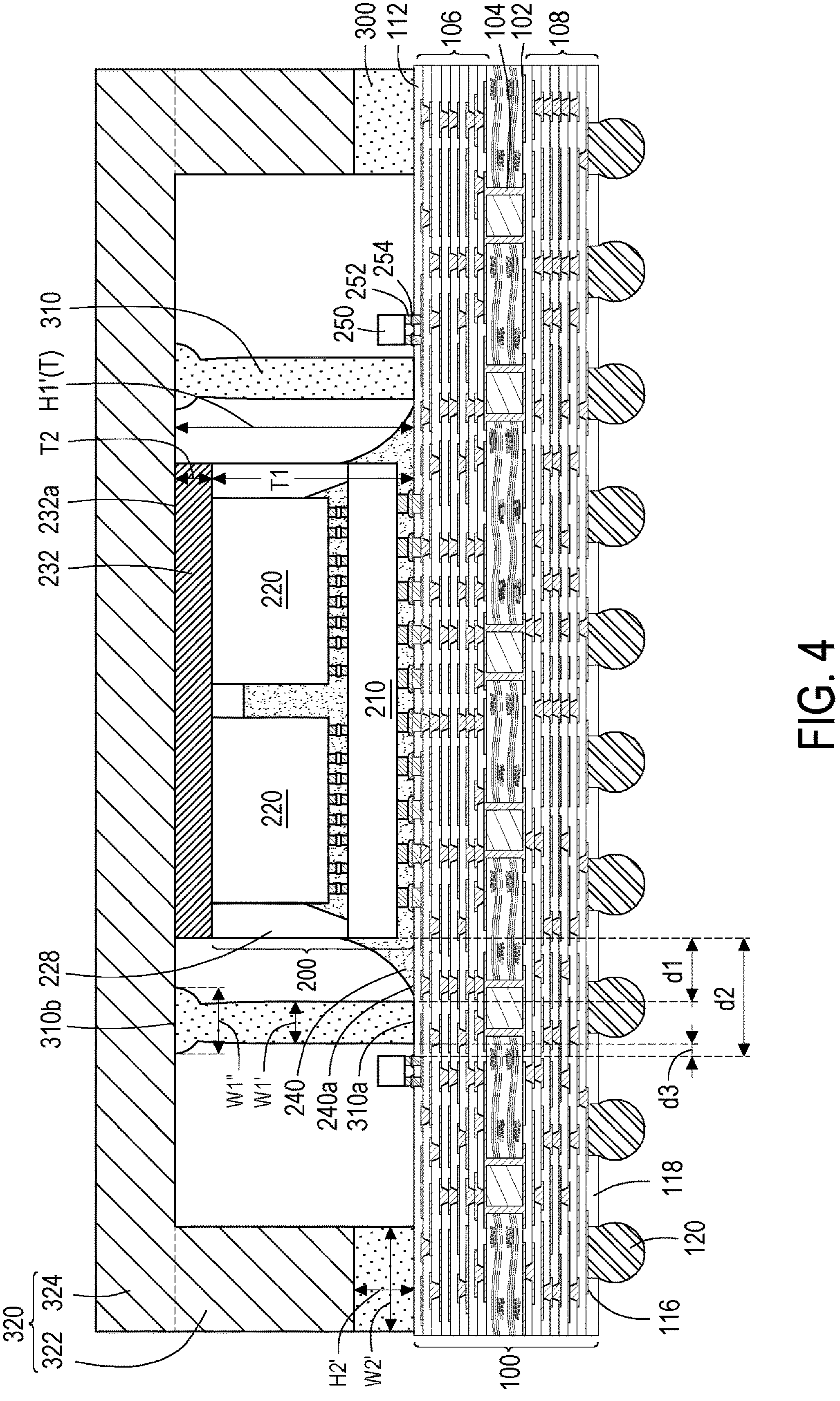
FIG. 4 is a cross-sectional view of a semiconductor device according to some embodiments.

In some embodiments, the adhesive pattern 310 is disposed between the passive device 250 and the adhesive layer 300. However, the disclosure is not limited thereto. In alternative embodiments, as shown in FIG. 4, the adhesive pattern 310 is disposed between the package component 200 and the passive device 250. In some embodiments, a distance d1 between the package component 200 and the adhesive pattern 310 is smaller than a distance d2 between the package component 200 and the passive device 250. The distance d1 is also a distance between the adhesive pattern 310 and the encapsulant 210, for example. A distance d3 is formed between the adhesive pattern 310 and the passive device 250. In some embodiments, the distance d1, d2 and d3 are respectively larger than 0. In other words, the adhesive pattern 310 is physically separated from the package component 200 and the passive device 250 without contacting, respectively. In some embodiments, the adhesive pattern 310 is physically separated from the underfill 240. The passive device 250 is disposed between the adhesive pattern 310 and the adhesive layer 300, for example.

Figure 5:
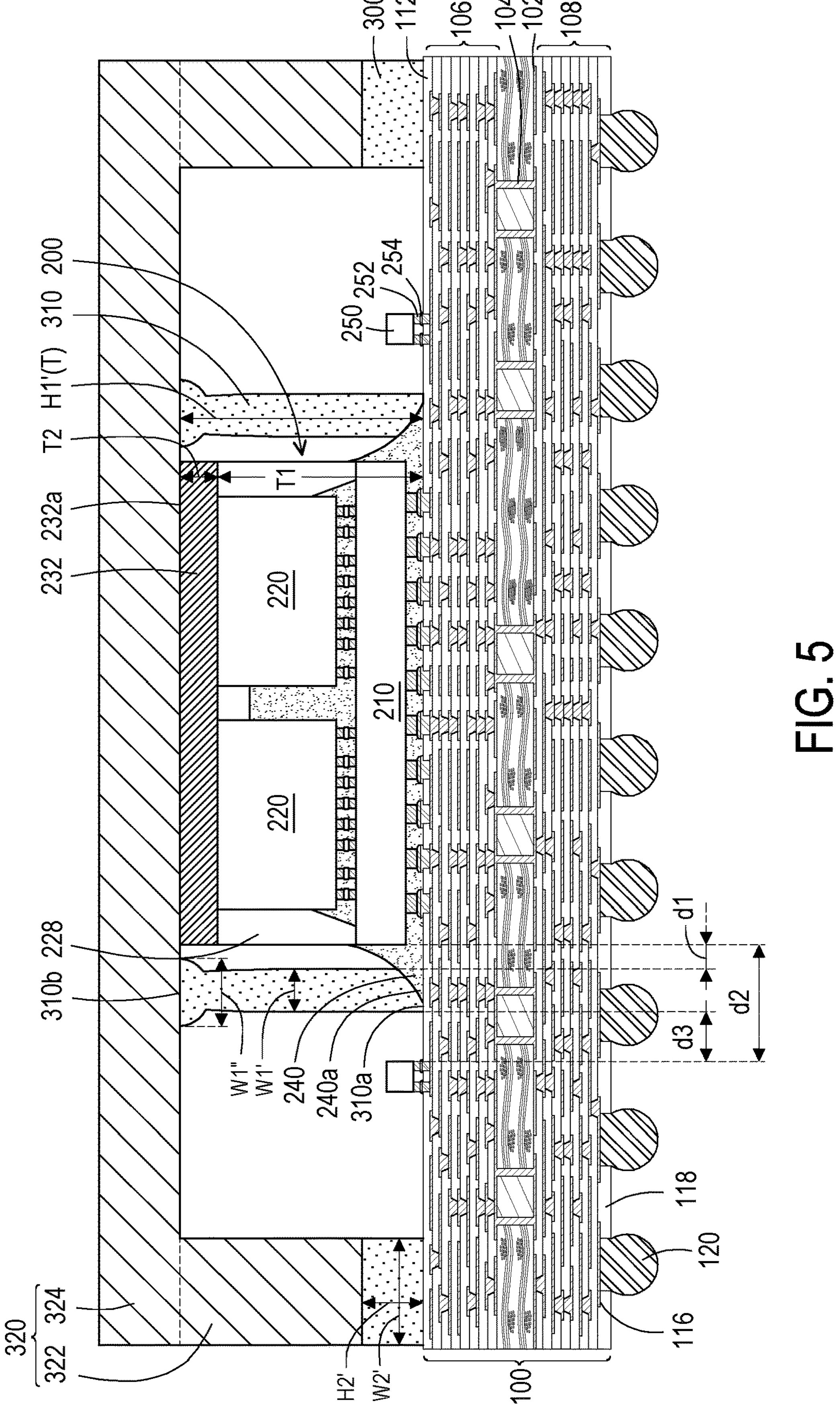
FIG. 5 is a cross-sectional view of a semiconductor device according to some embodiments.

In some embodiments, as shown in FIG. 5, the adhesive pattern 310 is disposed on the underfill 240 between the passive device 250 and the package component 200. Thus, the total dimension (e.g., a total width) of the semiconductor device may be reduced, and additionally, the total usage amount of the adhesive pattern 310 may be reduced since the underfill 240 serves as a booster for the adhesive pattern 310. In some embodiments, the adhesive pattern 310 at least covers the edge 240*a* of the underfill 240. The adhesive pattern 310 is in direct contact with the edge 240*a* of the underfill 240, for example. An interface may exist between the adhesive pattern 310 and the underfill 240. In some embodiments, a distance d1 between the package component 200 and the adhesive pattern 310 is smaller than a distance d2 between the package component 200 and the passive device 250, and thus the adhesive pattern 310 is disposed between the package component 200 and the passive device 250. A distance d3 is formed between the adhesive pattern 310 and the passive device 250. The distance d1, d2 and d3 is respectively larger than 0. In other words, the adhesive pattern 310 is physically separated from the package component 200 and the passive device 250 without contacting, respectively. In some embodiment, the adhesive pattern 310 is partially disposed on the underfill 240 and partially disposed on the package substrate 100. However, the disclosure is not limited thereto. In alternative embodiments, the adhesive pattern 310 is entirely disposed on the underfill 240 without contacting the package substrate 100.

Figure 6:
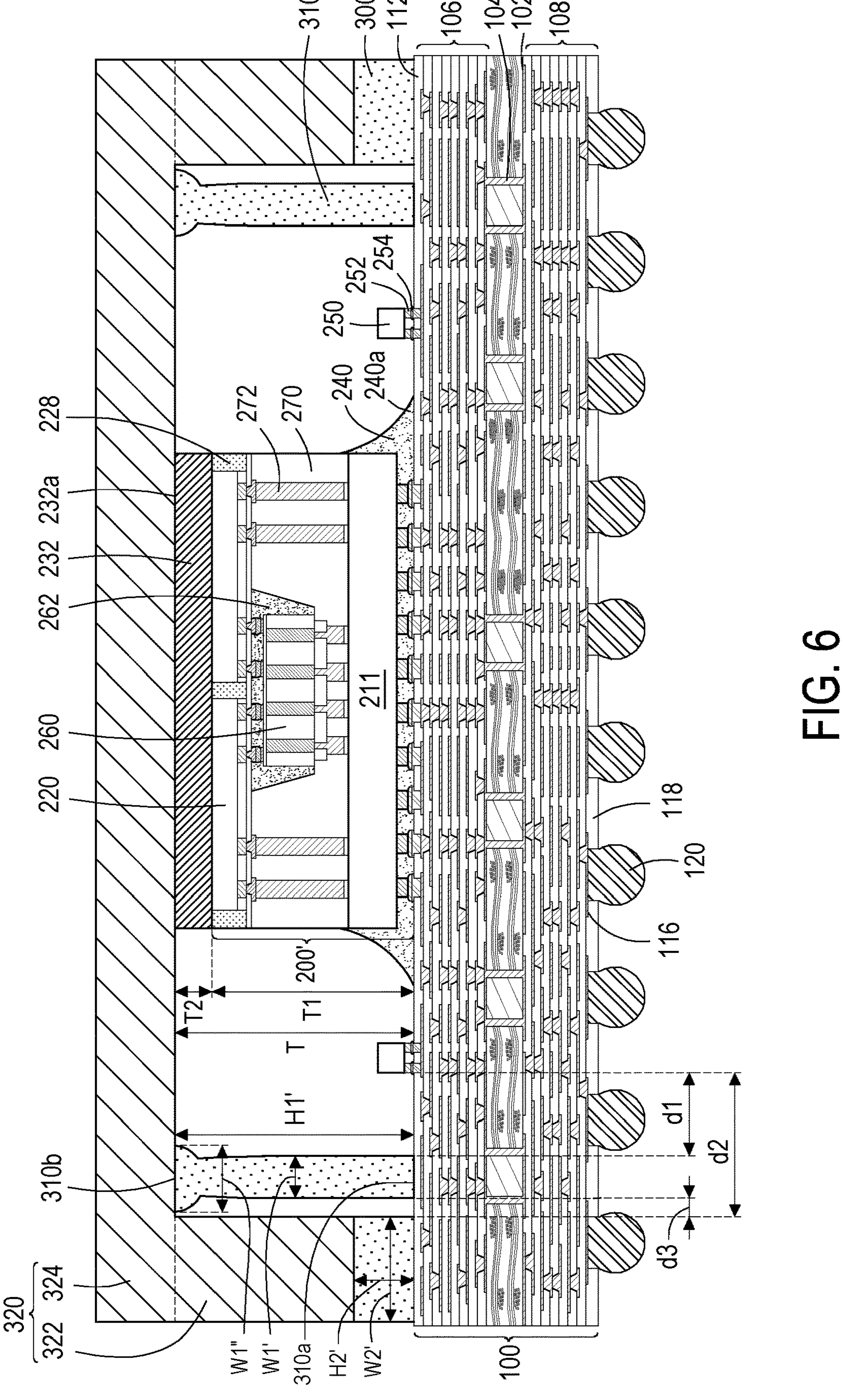
FIG. 6 is a cross-sectional view of a semiconductor device according to some embodiments.

In above embodiments, the package component 200 is illustrated as a Chip-on-Wafer (CoW) package, that is, the chips (e.g., integrated circuit dies 220) are bonded to the wafer (e.g., interposer 210). However, the disclosure is not limited thereto. The package component 200 may be any suitable three-dimensional integrated circuit device, For example, as shown in FIG. 6, the package component 200' is an Integrated fan out (InFO)-local silicon interconnect (LSI). In such embodiments, the integrated circuit dies 220 are electrically connected by a bridge die 260 (e.g., silicon interconnect) therebetween and therebelow, and then the formed package component is bonded to a RDL structure 211. The bridge die 260 is, for example, surrounded by an underfill 262, and the bridge die 260 and the underfill 262 are surrounded by an encapsulant 270 with through vias 272 therein. Then, the bridge die 260 is and the through vias 272 are further electrically connected to a RDL structure 211, the integrated circuit dies 220 are electrically connected to the RDL structure 211. In some embodiments, as shown in FIG. 6, the adhesive patterns 310 is formed to surround the package component 200' bonded to the package substrate 100, and thus the formed semiconductor device has an improved thermal dissipation as mentioned above.

According to some embodiments, a semiconductor device includes a package substrate, a package component, a lid and at least one adhesive pattern. The package component is bonded to the package substrate. The lid includes a first portion adhered to the package substrate through an adhesive layer and a second portion connecting to the first portion and covering the package component. The adhesive pattern is adhered to and disposed between the package substrate and the second portion of the lid.

According to some embodiments, a semiconductor device includes a package substrate, a package component and at least one adhesive pattern. The package component has a thermal interface material (TIM) layer thereon. The adhesive pattern has a first surface facing the package substrate and a second surface opposite to the first surface, and the second surface of the at least one adhesive pattern is substantially coplanar with a surface of the TIM layer.

According to some embodiments, a semiconductor device includes a package substrate, a package component, an underfill and at least one adhesive pattern. The package component is bonded to the package substrate. The underfill is disposed between the package substrate and the package component. The adhesive pattern is different from the underfill, and the at least one adhesive pattern is disposed on and in direct contact with the underfill.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a package substrate;

a package component, bonded to the package substrate;

a lid, comprising a first portion adhered to the package substrate through an adhesive layer and a second portion connecting to the first portion and covering the package component; and a plurality of first adhesive patterns, wherein the first adhesive patterns are adhered to and disposed between the package substrate and the second portion of the lid, the first adhesive patterns are disposed at a first side of the package component, and at least two of the first adhesive patterns are physically separated from each other and substantially aligned with each other in a first direction along which the first side is extended.

2. The semiconductor device of claim 1, wherein a material of the first adhesive patterns is substantially the same as a material of the adhesive layer.

3. The semiconductor device of claim 1, wherein a material of the first adhesive patterns comprises epoxy-based material, silicone-based material, a metal-based material or a combination thereof.

4. The semiconductor device of claim 1, wherein one of the first adhesive patterns has a portion in direct contact with the lid, and a width of the portion increases as the top portion becomes closer to the lid.

5. The semiconductor device of claim 1, further comprising a thermal interface material (TIM) layer between the package component and the second portion of the lid.

6. The semiconductor device of claim 5, wherein a height of the first adhesive patterns is substantially the same as a thickness of the TIM layer and the package component.

7. The semiconductor device of claim 1, wherein a total length of the first adhesive patterns is substantially the same as a length of the first side of the package component in the first direction.

8. The semiconductor device of claim 1, further comprising a plurality of second adhesive patterns disposed at a second side opposite to the first side of the package component and physically separated from one another.

9. The semiconductor device of claim 1, further comprising at least one passive device disposed between the first adhesive patterns and the package component.

10. The semiconductor device of claim 1, wherein the adhesive layer comprises a vent.

11. The semiconductor device of claim 1, wherein the adhesive layer is continuously disposed at the first side, a second side opposite to the first side and a third side different from the first and second sides.

12. A semiconductor device, comprising:

a package substrate;

a package component having a thermal interface material (TIM) layer thereon, and having a first side and a second side physically connecting to the first side;

a lid, adhered to the package substrate through an adhesive layer;

a plurality of first adhesive patterns, disposed at the first side of the package component, and disposed between the adhesive layer and the package component, wherein a distance between one of the first adhesive patterns and the first side of the package component is substantially equal to a distance between another of the first adhesive patterns and the first side of the package component; and at least one second adhesive pattern, disposed at the second side of the package component, and disposed between the adhesive layer and the package component.

13. The semiconductor device of claim 12, wherein the at least one second adhesive pattern comprises a plurality of second adhesive patterns.

14. The semiconductor device of claim 12, further comprising at least one third adhesive pattern disposed at a third side opposite to the first side of the package component and at least one fourth adhesive pattern disposed at a fourth side opposite to the second side of the package component.

15. The semiconductor device of claim 12, wherein at least one of the first adhesive patterns and the at least one second adhesive pattern are physically separated.

16. A semiconductor device, comprising:

a package substrate;

a package component, bonded to the package substrate;

a lid, adhered to the package substrate through an adhesive layer; and a plurality of first adhesive patterns, wherein the first adhesive patterns are arranged along a first side of the package component, and at least two of the first adhesive patterns are physically separated from each other and substantially aligned with each other in a first direction along which the first side is extended.

17. The semiconductor device of claim 16, wherein a distance between one of the first adhesive patterns and the first side of the package component is substantially equal to a distance between another of the first adhesive patterns and the first side of the package component.

18. The semiconductor device of claim 16, further comprising an underfill between the package substrate and the package component, wherein the underfill is disposed between the package component and the first adhesive patterns and physically separated from the first adhesive patterns.

19. The semiconductor device of claim 16, further comprising an underfill between the package substrate and the package component, wherein the first adhesive patterns are disposed on and in direct contact with the underfill.

20. The semiconductor device of claim 16, wherein the first adhesive patterns cover an edge of the underfill on a sidewall of the package component.

* * * * *